United States Patent
Schmid et al.

(10) Patent No.: US 9,203,042 B2
(45) Date of Patent: Dec. 1, 2015

(54) ELECTRONIC COMPONENT AND METHOD FOR PRODUCING AN ELECTRONIC COMPONENT

(75) Inventors: Günter Schmid, Hemhofen (DE); Arvid Hunze, Kleinblittersdorf (DE)

(73) Assignees: OSRAM Opto Semiconductors GmbH, Regensburg (DE); Siemens Aktiengesellschaft, Munich (DE)

( * ) Notice: Subject to any disclaimer, the term of this patent is extended or adjusted under 35 U.S.C. 154(b) by 576 days.

(21) Appl. No.: 13/375,207

(22) PCT Filed: May 28, 2010

(86) PCT No.: PCT/EP2010/057482
§ 371 (c)(1),
(2), (4) Date: Feb. 6, 2012

(87) PCT Pub. No.: WO2010/136591
PCT Pub. Date: Dec. 2, 2010

(65) Prior Publication Data
US 2012/0193816 A1 Aug. 2, 2012

(30) Foreign Application Priority Data
May 29, 2009 (DE) .......................... 10 2009 023 350

(51) Int. Cl.
H01L 23/28 (2006.01)
H01L 21/56 (2006.01)
H01L 51/10 (2006.01)
H01L 51/44 (2006.01)
H01L 51/52 (2006.01)

(52) U.S. Cl.
CPC ............ H01L 51/107 (2013.01); H01L 51/448 (2013.01); H01L 51/5237 (2013.01); Y02E 10/549 (2013.01)

(58) Field of Classification Search
None
See application file for complete search history.

(56) References Cited

U.S. PATENT DOCUMENTS

| | | | |
|---|---|---|---|
| 5,545,432 A | * | 8/1996 | DeGuire et al. .............. 427/226 |
| 7,005,199 B2 | | 2/2006 | Kim et al. |
| 7,298,013 B2 | | 11/2007 | Schmid et al. |
| 2005/0189536 A1 | | 9/2005 | Zschieschang et al. |
| 2005/0260803 A1 | | 11/2005 | Halik et al. |
| 2006/0160272 A1 | | 7/2006 | Effenberger et al. |
| 2006/0264020 A1 | | 11/2006 | Lazovsky et al. |
| 2007/0020451 A1 | | 1/2007 | Padiyath et al. |
| 2007/0273280 A1 | | 11/2007 | Kim et al. |

(Continued)

FOREIGN PATENT DOCUMENTS

| | | |
|---|---|---|
| CN | 1612372 | 5/2005 |
| CN | 101038882 | 9/2007 |

(Continued)

OTHER PUBLICATIONS

Xia, Y. et al. "Softlithographie", Angew. Chem. 110, 1998, pp. 569-594.

(Continued)

*Primary Examiner* — David Sample
*Assistant Examiner* — Donald M Flores, Jr.
(74) *Attorney, Agent, or Firm* — Cozen O'Connor

(57) ABSTRACT

An electronic component having an encapsulation which has at least two double layers is described. In addition, a method for producing an electronic component in which a layer sequence is encapsulated is described.

12 Claims, 7 Drawing Sheets

(56) References Cited

U.S. PATENT DOCUMENTS

| | | |
|---|---|---|
| 2008/0032109 A1 | 2/2008 | Leising et al. |
| 2008/0113178 A1 | 5/2008 | Lazovsky et al. |
| 2008/0163926 A1 | 7/2008 | Huang et al. |
| 2008/0290337 A1 | 11/2008 | Halik et al. |

FOREIGN PATENT DOCUMENTS

| | | |
|---|---|---|
| DE | 10328810 | 1/2005 |
| DE | 10328811 | 1/2005 |
| DE | 10 2004 022 603 | 12/2005 |
| DE | 10 2004 025 423 | 12/2005 |
| JP | 05-152071 | 6/1993 |
| JP | 07-192867 | 7/1995 |
| JP | 2000-068047 | 3/2000 |
| JP | 2004-039448 | 2/2004 |
| JP | 2005-100815 | 4/2005 |
| JP | 2005-166655 | 6/2005 |
| JP | 2005-216677 | 8/2005 |
| JP | 2007-317646 | 12/2007 |
| JP | 2008-129393 | 6/2008 |

OTHER PUBLICATIONS

Folkers et al. "Self-Assembled Monolayers of Long-Chain Hydroxamic Acids on the Native Oxide of Metals", Langmuir, vol. 11, No. 3, 1995, pp. 813-824. J.

Halik et al. "Low-voltage organic transistors with an amorphous molecular gate dielectric", Nature vol. 431, Oct. 21, 2004, pp. 963-966.

* cited by examiner

ELECTRONIC COMPONENT AND METHOD FOR PRODUCING AN ELECTRONIC COMPONENT

RELATED APPLICATIONS

This is a U.S. National Phase Application under 35 USC 371 of International Application PCT/EP/2010/057482 filed on May 28, 2010.

This application claims priority of German application no. 10 2009 023 350.4 filed May 29, 2009, the entire content of which is hereby incorporated by reference.

FIELD OF THE INVENTION

The invention relates to an electronic component and to a method for producing an electronic component.

BACKGROUND OF THE INVENTION

The service life of electronic components depends inter alia on their being shielded from atmospheric oxygen and moisture, since they often contain reactive materials, for example metals susceptible to corrosion, or hygroscopic layers. For example, electronically excited organic molecules may readily react with oxygen or water during operation of an electronic component, so limiting their service life.

SUMMARY OF THE INVENTION

One object of the invention is to provide an electronic component which has improved shielding.

According to one embodiment, an electronic component is provided which comprises a substrate, a layer sequence, which comprises at least one functional layer, on the substrate, and an encapsulation, which is arranged on the layer sequence and the substrate and, together with the substrate, completely encloses the layer sequence. The encapsulation here comprises at least two double layers, a double layer having a first layer and a second layer, and the first layer being an organic monomolecular layer having a two-dimensional order. This two-dimensional order may be amorphous.

A multilayer system of double layers, which in each case comprise a first and a second layer, is accordingly provided, the first and second layers being arranged alternately one above the other, such that a dense encapsulation is produced. The outermost layers of the encapsulation may be either first or second layers, i.e. the layer of the encapsulation adjoining the layer sequence may be a first or a second layer and the layer of the encapsulation furthest from the layer sequence may be a first or a second layer of the encapsulation. The encapsulation shields the layer sequence, which contains at least one functional layer, from atmospheric oxygen and moisture, such that layers in the layer sequence which are susceptible to reaction to atmospheric oxygen and/or moisture are protected. In this way, the service life of these layers and thus also of the electronic component is extended.

The first layer may comprise linear molecules with a length which is selected in the range from 0.5 nm to 5 nm and have a thickness which corresponds to the length of the linear molecules. A first layer of a double layer of the encapsulation is provided therewith, which first layer may have a thickness of 0.5 nm to 5 nm, for example the thickness of the first layer may be between 1 and 3 nm.

The linear molecules may comprise a first end group, a middle group and a second end group. The first end group may for example be an anchor group and the second end group may for example be a head group. Suitable selection of the first and the second end groups ensures that the first layer may be effectively coupled to the second layer or to the second layer of a further double layer. Furthermore, suitable selection of the first and second end groups ensures effective coupling of the respective end groups to one another, such that the first layer has a high density and thus chemical and thermal stability.

Such linear molecules which have a first end group on one end are capable of forming thin, monomolecular layers (self-assembling monolayers (SAM)) on surfaces. The monomolecular layers may also be referred to as self-organising monolayers.

A first layer, which is formed from the above-described linear molecules, is capable of forming, for example, covalent bonds with the second layer and therefore adheres well to the surface of the second layer. Bonding to the surface of the second layer may proceed spontaneously and directionally. This gives rise to a two-dimensional order in the organic monomolecular layer, with which particularly dense first layers may be produced. For example, it is possible for instance to produce very thin dielectrics which have no or few leakage current paths, as may be demonstrated by high breakdown voltages. As a result, the monomolecular layers are also impermeable or virtually impermeable to relatively large molecules, for example water or oxygen. Defects, such as for example pinholes, in the second layer which are smaller than 10 nm may be closed by the linear molecules of the first layer. Because the first layer comprises a monomolecular layer, the total thickness of the encapsulation may be made very small, so permitting economies in both material and process costs.

The middle group of the linear molecules may be a molecule chain and be selected from a group which comprises linear alkyls, linear fluorinated alkyls, polyethylene glycol and polyethylenediamine. The middle groups may influence the electrical properties of the first layer by insulating aliphatic systems or electrically conductive conjugated double bonds being selected as the middle group as required.

Linear alkyls may have 2 to 20 carbon atoms, for example 10 to 18 carbon atoms. Linear fluorinated alkyls may also have 2 to 20, for example 10 to 18 carbon atoms. For example, linear alkyls with 2 to 20 carbon atoms may have aryl groups as second end group which, by forming pi-pi interactions, stabilise the linear molecules among themselves and with regard to the adjoining second layer. The aryl groups may be substituted or unsubstituted. Substituents may be fluorinated and/or unsaturated alkyl groups, halides or compounds containing S, N or P. Various linear molecules may also be used to produce a first layer.

The first end group may be selected from a group comprising hydroxamic acids, oximes, isonitriles, phosphines, $R_1$—$Si(R_2)$—$R_3$, O=C—$R_4$, O=P($R_5$)—$R_6$ and O=S($R_7$)=O. $R_1$, $R_2$, $R_3$ are here mutually independently selected from H, Cl, Br, I, OH, O-alkyl groups, benzyl groups and unsaturated alkenyl groups, wherein at least one of $R_1$, $R_2$ and $R_3$ is not H. $R_4$ may furthermore be selected from H, Cl, Br, I, OH, OSi$R_1R_2R_3$, O-alkyl groups, benzyl groups and unsaturated alkenyl groups. $R_5$ and $R_6$ may mutually independently be selected from H, Cl, Br, I, OH, O-alkyl groups, benzyl groups and unsaturated alkenyl groups. $R_7$ may furthermore be selected from Cl, Br, I, OH, O-alkyl groups, benzyl groups and unsaturated alkenyl groups.

Examples of linear molecules of the first layer, which have the above-stated properties, may be of the structure according to formula 1.

Formula 1

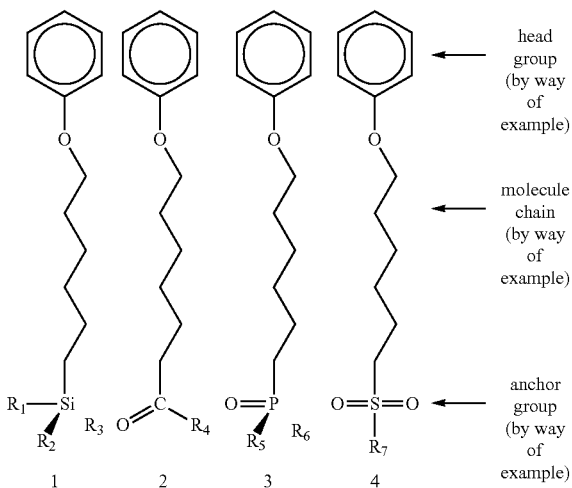

head group (by way of example)

molecule chain (by way of example)

anchor group (by way of example)

For all of $R_1$ to $R_7$ it is the case that alkyl groups may, for example, be methyl, ethyl, n-propyl, i-propyl, n-butyl, sec-butyl, tert.-butyl, and the branched and branched higher homologues thereof. $R_4$ may be $OSiR_1R_2R_3$ with $R_1$, $R_2$, $R_3$ mutually independently being only alkyl or H. The first end group $O=P(R_5)-R_6$ is capable of forming particularly stable bonds to the adjoining second layer and/or adjacent first end groups.

The second end group may be selected from a group which comprises the first end group, unsubstituted aryl groups, substituted aryl groups, substituted aromatics, unsubstituted aromatics, substituted heteroaromatics and unsubstituted heteroaromatics. For example, the second end group may be furan, thiophene, pyrrole, oxazole, thiazole, imidazole, isoxazole, isothiazole, pyrazole, benzo[b]furan, benzo[b]thiophene, indole, 2H-isoindole, benzothiazole, pyridine, pyrazine, pyrimidine, pyrylium, α-pyrone, γ-pyrone, quinoline, isoquinoline, bipyridine and respective derivatives. Examples of second end groups are shown in formula 2.

Formula 2

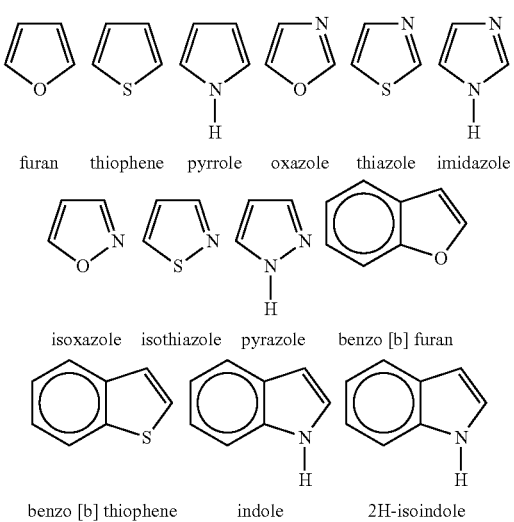

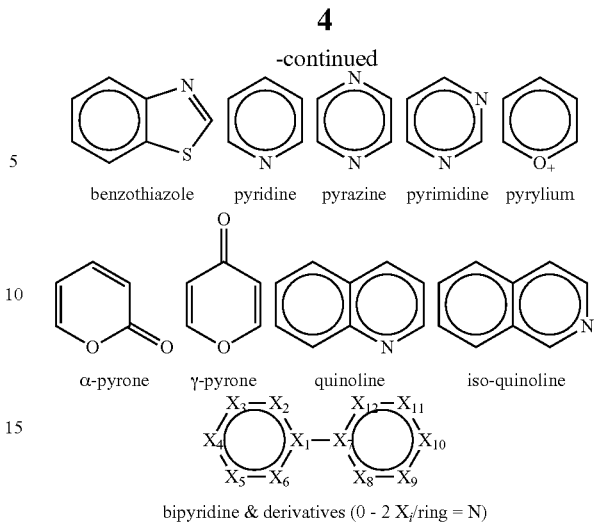

The second end groups may be attached to the middle group directly or via the heteroatoms O, S, N, P. Attachment via the C—C double bond or C—C triple bond is also possible. The second end group may include substituents which include constituents of the first end group. The second end group may also be a methyl group or a methyl group which has been oxidised to yield a carboxyl group. An adjoining second layer may thus be effectively attached to the first layer.

The second layer may include a material which is selected from a group which comprises metals, metal alloys, metal oxides and polymers. Metals may for example be non-reactive or self-passivating metals or metal alloys, for example Al, Cr, Ni, Fe, Ag, stainless steel, $AlMg_3$ and further aluminium alloys. Metal oxides may for example be selected from $SiO_2$ or $Al_2O_3$ and from indium-tin oxide (ITO) or zinc oxide, which may be deposited by known methods. Polymers may for example be parylenes, acrylates or novolaks. When polymers are used as the second layer, a high OH group density should be present on the surface of the second layer so that a stable connection to the adjoining first layer can be formed. A high OH density may be achieved, for example, with an OH group on at least every tenth monomer unit. Poly-o-hydroxystyrene or polyvinyl alcohol, for example, have a high OH density. If a plurality of double layers with in each case a second layer are arranged on the layer sequence and the substrate, different materials may also be selected for individual second layers.

The second layer may have a thickness which is selected in the range from 5 nm to 1 μm. For example, the thickness may be selected from a range from 50 nm to 1 μm. The greater the selected thickness of the second layer, the denser is the second layer. A hermetically dense second layer may thus be provided.

If the second layer takes the form of a metal layer, the latter may have pinholes which cannot be closed by further deposition of metal atoms, since pinholes are not wetted by the newly deposited metal atoms. Deposition of a first layer may then result in the surface energy being reduced if the metal is more poorly wetted on the first layer than on the metal atoms. The pinhole is thus closed up with material of the first layer and then with further metal atoms and the final result is a thin, dense layer sequence.

All in all, a double layer of slight thickness is provided since both the first and the second layer may take the form of thin layers. A dense, thin-film encapsulation of the electronic component is thus provided. The thin-film encapsulation may here have up to 30 double layers.

Chemical bonds and/or complex bonds and/or van der Waals interactions may be present between the second layer and the first end groups of the first layer and/or between the second layer and the second end groups of the first layer. Stable bonds are thus formed between the individual layers of the double layers, giving rise to a dense encapsulation.

The encapsulation may furthermore have at least one third layer, which binds water and oxygen molecules. This binding may proceed chemically and increases the encapsulation properties of the double layers. Ca, Mg, Yb, Ba or Sr may, for example, be selected as the material for the third layer. The at least one third layer may be arranged between the double layers.

The layer sequence of the electronic component may be selected from a group which comprises organic light-emitting diodes, organic magnetoresistive components, inorganic magnetoresistive components, electrochromic display elements, organic solar cells, inorganic solar cells, organic photodiodes, inorganic photodiodes, organic sensors, inorganic sensors and surface wave filters. Magnetoresistive components may here exhibit the GMR or TMR effect. Electrochromic display elements may be pixellated or segmented. For example, Si chips bonded on printed circuit boards may be hermetically shielded by the above-described double layers.

A method for producing an electronic component is furthermore provided. The method comprises the following method steps A) arranging a layer sequence which comprises at least one functional layer on a substrate, B) arranging an encapsulation with at least two double layers on the substrate and the layer sequence, such that the layer sequence is completely enclosed by the substrate and the encapsulation, method step B) comprising the method steps B1) application of a first layer and B2) application of a second layer, the first layer to be produced being an organic monomolecular layer with a two-dimensional order. Method steps B1) and B2) are here alternately repeated at least twice, such that at least two double layers which in each case comprise a first layer and a second layer are produced. A straightforwardly performed method is thus provided with which a layer sequence, which is sensitive to oxygen and/or moisture, is encapsulated.

In method step B2), a material for the second layer may be applied using a method which is selected from a group which comprises vapour deposition, sputtering, printing and electroless metallisation. Metals, metal alloys, metal oxides and polymers may be selected as the material for the first layer. Polymers may also be applied from the gas phase or liquid phase and be modified by an $O_2$ plasma so that an elevated OH group density is present on the surface.

In method step B1), a material for the first layer may be applied from the gas phase or from a solution. Linear molecules with a first end group, a middle group and a second end group as described above may be used as the material for the first layer.

If the material for the first layer is applied from a solution in method step B1), heat treatment and/or a step of exposure to light may be carried out subsequent to method step B2) in order to improve the connection of the first layer to the second layer. Rinsing is then performed in order to remove excess material of the first layer which is not bound to the second layer.

The material of the first layer may, if it is applied in a solution, be present in a concentration of 0.0001 mol/l to 1 mol/l dissolved in a solvent or solvent mixture. Solvents may be selected from a group which comprises hydrocarbons for example pentane, hexane, heptane, octane, benzene, toluene, xylene, cresol, tetralin and decalin, chlorinated hydrocarbons, for example dichloromethane, chloroform, carbon tetrachloride, trichloroethylene, chlorobenzene and dichlorobenzene, alcohols, for example methanol, n-propanol, i-propanol and butanol, ethers or cyclic ethers, for example diethyl ether, diphenyl ether, tetrahydrofuran and dioxane, esters such as for example acetic acid esters, dimethylformamide, dimethyl sulfoxide, N-methylpyrrolidone, γ-butyrolactone and cyclohexanone.

If the material for the first layer is applied in method step B1) from the gas phase, the material of the first layer may be applied diluted or undiluted from a vacuum chamber. The material may here be present in the gas phase in a proportion of 1%. Without dilution, the proportion of the material in the gas phase amounts to 100%. Noble gases such as for example He, Ne, Ar, Kr or Xe or inert gas such as $N_2$ are used to dilute the first layer material. More readily vaporisable derivatives of the materials for the first layer may be used for deposition. The pressure during deposition may amount to $10^{-8}$ mbar to 1000 mbar while the temperature may amount to 200° C. Deposition may proceed, for example, for 0.1 min to 10 min. Subsequent to deposition, excess first layer material may be pumped out or removed by heating. Reactive silanes, for example, may be fixed by introducing water into the gas phase, resulting in polymerisation of the free Cl ends of the silane.

In method step B2), a chemical bond and/or a complex bond and/or a van der Waals interaction may be formed between the first layer and the second layer. If a second double layer is deposited onto a first double layer, a chemical bond and/or a complex bond and/or a van der Waals interaction may likewise be formed between the second layer of the first double layer and the first layer of the second double layer.

Should defects arise in the second layer during production of the second layer, such that the second layer is present in subzones, these may be closed by the first layer of the next double layer deposited thereon. The linear molecules of the first layer spontaneously orient themselves perpendicular to the second layer, such that, at defects, linear molecules of the first layer arrange themselves parallel to the subzones of the second layer. In this way, the density of the second layer may be obtained and reliable encapsulation be produced.

The order of method steps B1) and B2) is not predetermined. Accordingly, firstly a first layer and then a second layer or firstly a second layer and then a first layer may be deposited on the layer sequence provided in method step A). If method step B1) is carried out first, namely a first layer is deposited first onto the layer sequence, groups, for example metallic groups, must be present in the layer sequence which enable attachment of the first layer onto the layer sequence. The method step performed last within method step B) may equally well be method step B1) or B2). If still further layers or elements are applied to the encapsulation in subsequent method steps, method step B) may, for example, be terminated with method step B1), i.e. application of a first layer. In this case, the first layer may serve as coupling agent.

DETAILED DESCRIPTION OF THE DRAWINGS

Figure 1:
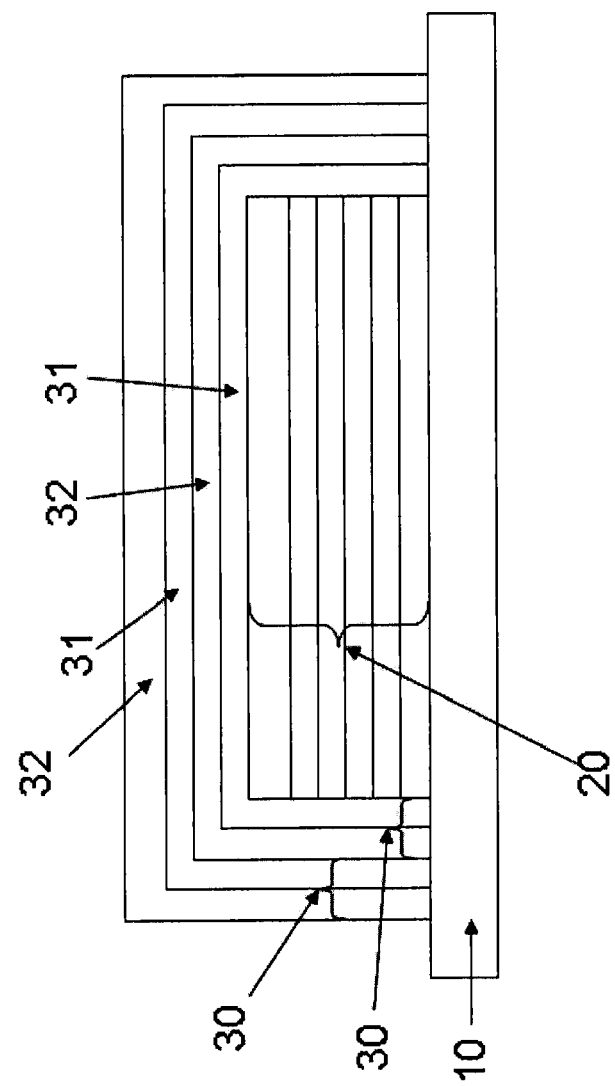
FIG. 1 shows a schematic side view of an electronic component with encapsulation.

FIG. 1 shows a schematic side view of an electronic component. A layer sequence 20 is applied to the substrate 10. By way of example, a layer sequence 20 with six layers is shown here, it also being possible for more or fewer layers to be present in the layer sequence.

At least one layer in the layer sequence is a functional layer, for example a radiation-emitting layer. Furthermore, at least of one the layers in the layer sequence 20 is sensitive to oxygen and/or atmospheric humidity.

Two double layers 30 are arranged on the layer sequence 20 and the substrate 10, such that the substrate 10 and the double layers 30 together completely enclose the layer sequence 20. The double layers 30 in each case comprise a first layer 31 and a second layer 32, which are arranged alternately one above the other. FIG. 1 shows, by way of example, two double layers 30 but a greater number of double layers 30 may also be selected.

The double layers 30 may, for example, be deposited from the gas phase onto the layer sequence 20. The substrate may here be exposed in a vacuum chamber to the dilute or undiluted vapours of the corresponding compound for 0.1 min to 10 min. The pressure here lies for example between $10^{-8}$ mbar and 1000 mbar. The temperature may lie in a range from 20° C. to 300° C., for example below 200° C. Both the first and the second layer may be deposited in the same vacuum chamber. If the first layer material selected has a phosphonic acid, carboxylic acid or a sulfonic acid group as the first end group, the esters thereof or other reactive derivatives may be used, which are more readily vaporisable.

In principle, a first layer may be deposited first onto the layer sequence or a second layer may be deposited first. If the first layer is deposited first, groups must be present on the layer sequence which are capable of binding to the first layer. These groups may, for example, be metal groups. The outer layer of the encapsulation may likewise be a first layer or a second layer. If the outer layer is a first layer, the latter may for example also serve as a coupling agent for further elements or layers which are to be applied. In FIG. 1, by way of example, a first layer 31 is applied to the layer sequence and the encapsulation terminates with a second layer 32.

Figure 2:
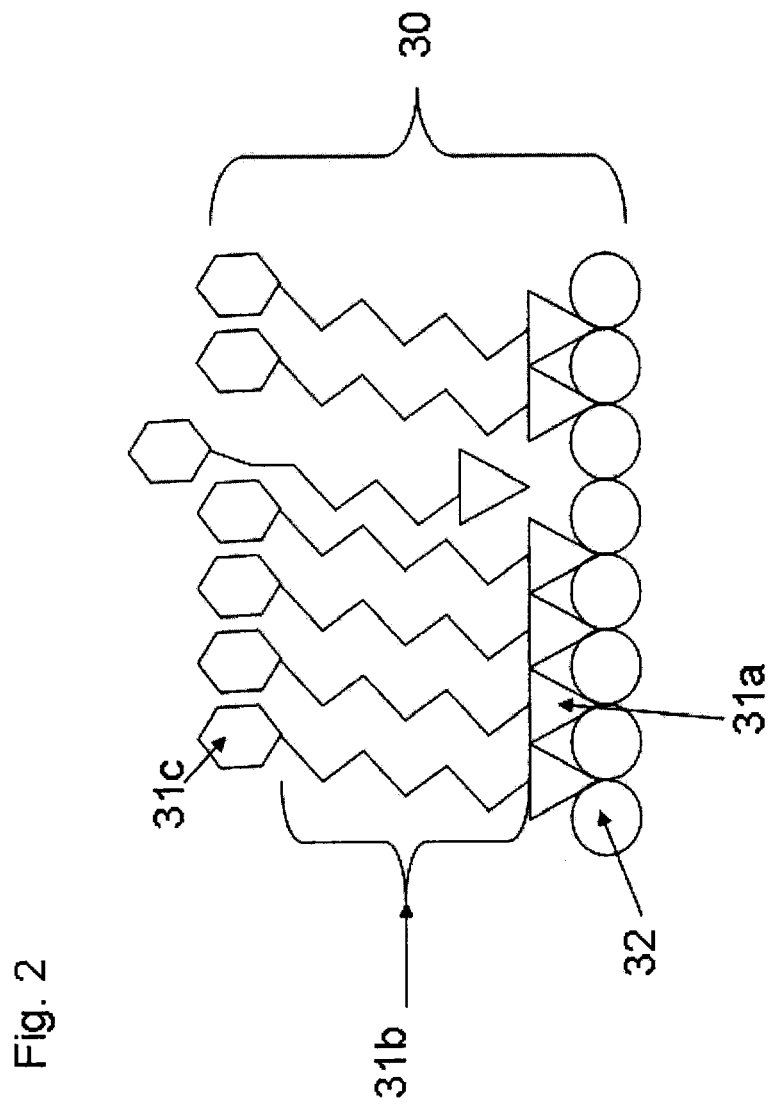
FIG. 2 shows a schematic side view of a double layer.

FIG. 2 shows a schematic side view of a double layer 30. The first layer 31 and the second layer 32 are here shown enlarged as a composition of molecules illustrated schematically. The materials described above may be selected as the materials for this purpose.

The first layer 31 comprises a material which comprises a first end group 31a, a middle group 31b and a second end group 31c. The first end group 31a is capable of forming a chemical bond, a complex bond or a van der Waals interaction with the second layer 32. The first and second layer 31 and 32 are thus connected tightly together. The second end group 31c is capable of likewise entering into a bond with a subsequent second layer 32 of a further double layer 30. The second end groups 31c may furthermore form interactions among one another, such that the second layer is formed densely. The middle group 31b may also be such that it is capable of forming interactions with itself between the individual molecules. The linear molecules of the first layer 31 are arranged in a two-dimensional order on the second layer 32. An overall dense double layer 30 is formed as a result.

Figure 3:
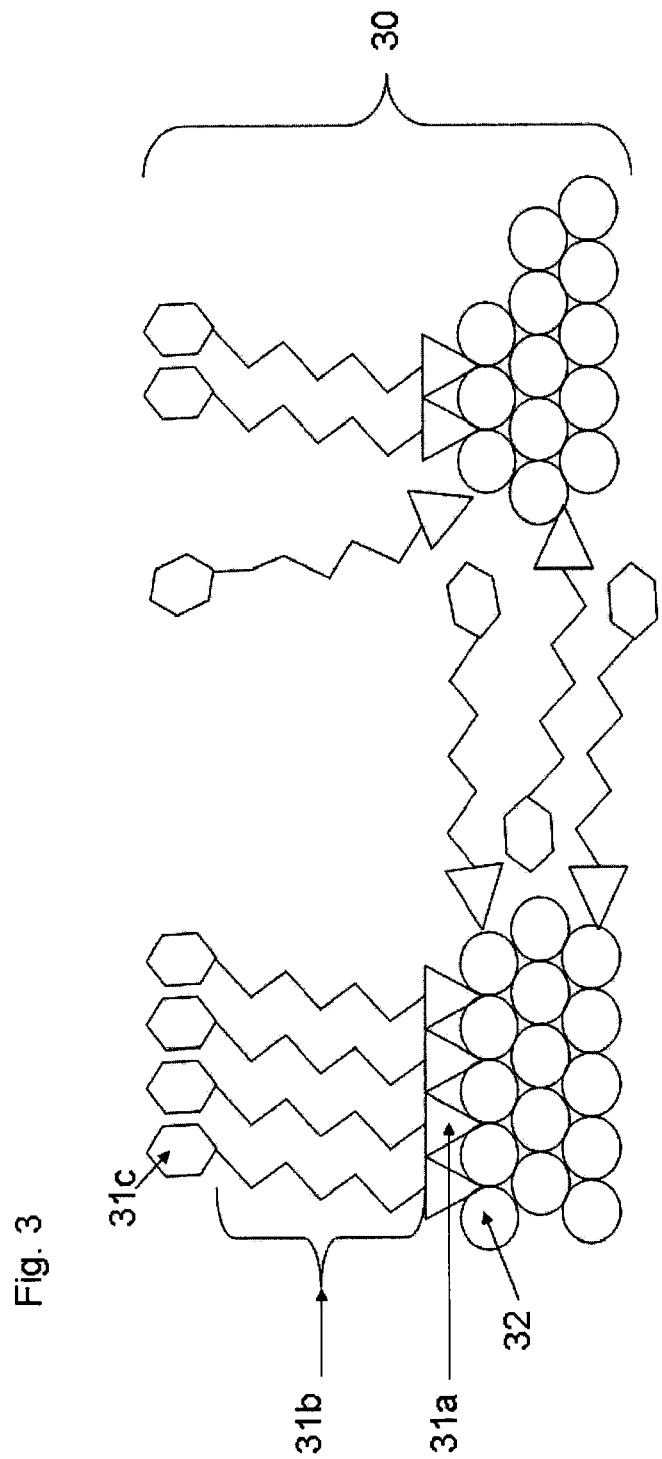
FIG. 3 shows a schematic side view of a further double layer with a defect.

FIG. 3 shows a further variant of a schematic side view of a double layer 30. In this case, a defect, for example a pinhole, is present in the second layer 32, for example a metal layer. This defect is filled by linear molecules of the first layer 31 being arranged between the sub-zones of the second layer 32 and thus sealing the second layer 32. Defects which may arise during the production of a second layer 32 may thus be eliminated by application of the first layer. This sealing mechanism works particularly well for defects in the second layer which are smaller than 10 nm. A plurality of double layers must be applied for larger pinholes.

Figure 4:
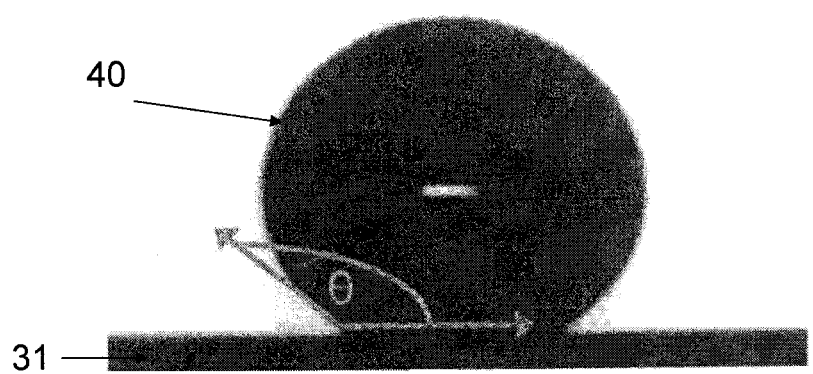
FIG. 4 shows the absorption of a water drop on a surface of the first layer.

FIG. 4 shows the absorption of a water drop 40 on the surface of a first layer 31. The water drop 40 may be seen to form a large contact angle Θ to the first layer 31. This demonstrates the strong hydrophobic properties of the surface of the first layer, which bring about the good shielding properties of the double layer 30, which comprises the first layer.

For this picture, an $AlMg_3$ substrate of a size of 15 mm×25 mm and a thickness of 0.5 mm was cleaned with N-methylpyrrolidone and then degreased with acetone and isopropanol. In an aqueous solution of sodium hydrogencarbonate, the native oxide layers, which arise by self-passivation, are removed at a current of 150 mA at 8 to 10 V by connecting the substrate as cathode, i.e. by selecting a reductive cleaning method. The substrate was then immersed in a solution of octadecylphosphonic acid (100 mg) in isopropanol (100 ml) for 30 minutes. After rinsing with isopropanol and subsequent drying in a stream of nitrogen, the surface is sealed with a monolayer of octadecylphosphonic acid. On the surface treated in this manner, the water drop 40 exhibits a contact angle of the order of 120°.

The above-stated example may also be carried out with other aluminium alloys or pure aluminium. Copper, nickel or titanium may also be coated in a similar manner instead of aluminium alloys. Hexylphosphonic acid or decylphosphonic acid may also be used instead of octadecylphosphonic acid. A trichlorosilyl group may also be used as first end group instead of the phosphonic acid. In this case, anhydrous toluene is used as solvent and operations are carried out under an inert atmosphere, for example nitrogen or argon.

Figure 5:
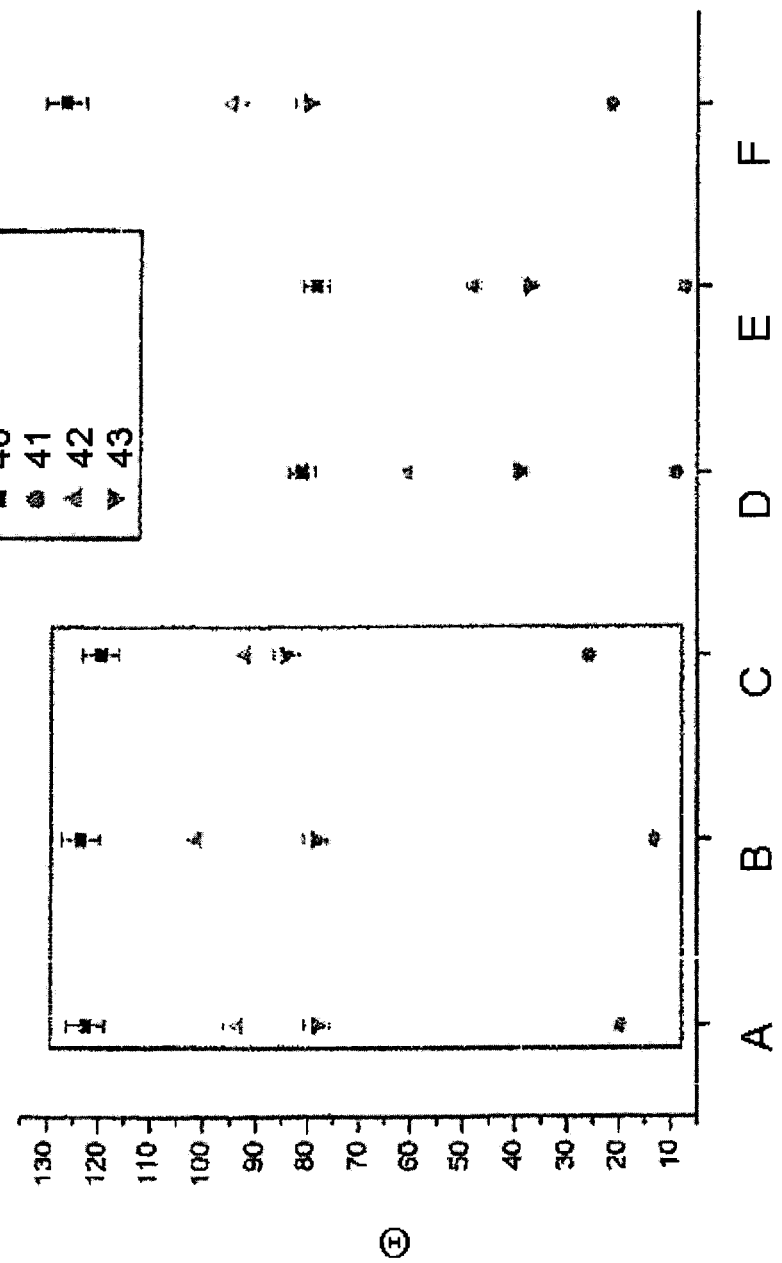
FIG. 5 shows a diagram with contact angle measurements on a surface of the first layer.

FIG. 5 summarises the measured contact angles Θ on the respective surfaces for the above-stated examples. $AlMg_3$ was in each case used as the second layer. The length of the middle group of the linear molecules in the first layer amounts 16 to 18 carbon atoms, thus hexyl, decyl or octadecyl. Phosphonic acid or trichlorosilyl groups are used as the first end group. The contact angle Θ is measured using the media water 40, hexadecane 41, ethylene glycol 42 or dimethyl sulfoxide (DMSO) 43. The materials of the first layer are hexanephosphonic acid A, decanephosphonic acid B, octadecanephosphonic acid C, hexane trichlorosilane D, decane trichlorosilane E and octadecane trichlorosilane F. The contact angle Θ is stated in degrees.

The larger is the contact angle Θ, the greater are the hydrophobic properties of the double layer 30. Molecules with a phosphonic acid molecule as first end group (end groups A, B and C) thus form the densest first layers. In the case of the trichlorosilyl group as the first end group (end groups D, E and F), octadecyltrichlorosilane as the longest molecule yields only slightly smaller contact angles Θ than the molecules with phosphonic acid as the first end groups. This would suggest that octadecylphosphonic acid will exhibit particularly preferred properties in a double layer 30. The linear molecules with trichlorosilyl groups as first end groups may likewise be applied in the gas phase.

Figure 6:
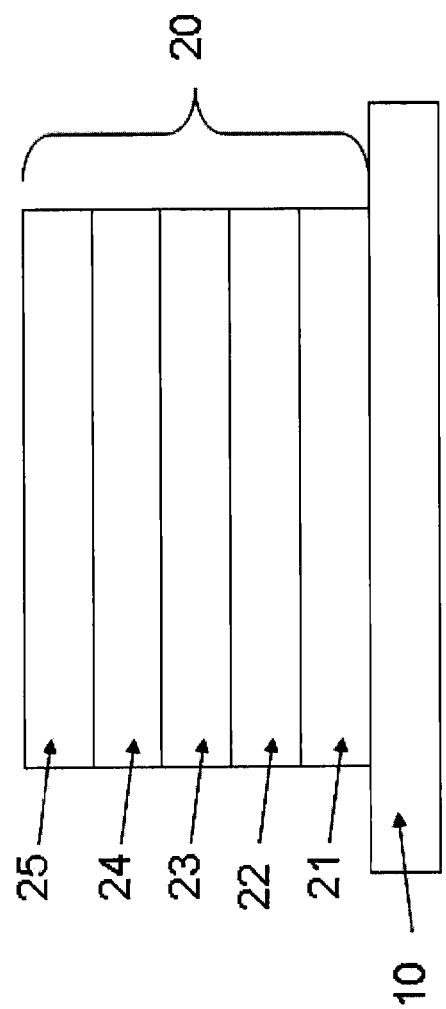
FIG. 6 shows a schematic side view of a layer sequence.

FIG. 6 shows a schematic side view of a layer sequence 20 on the substrate 10, which may be encapsulated by the above-described double layers 30. The example layer sequence comprises an anode 21, a hole transport layer 22, an organic emission layer 23 as functional layer, an electron transport layer 24 and a cathode 25. An electron injection layer for example of Ca or LiF may also be present in the layer sequence. Said electron injection layer may be arranged between the electron transport layer and the cathode (not shown here). The substrate 10 may for example be a glass substrate, the anode may contain indium-tin oxide and the cathode may be metal cathode.

This example layer sequence 20 may be deposited and patterned by successive vapour deposition processes, for example resulting in the production of an OLED. When producing the OLED, a 120 nm thick aluminium cathode is finally applied by vapour deposition. The substrate 10 with the layer sequence 20 on the substrate 10 is introduced into a vacuum chamber for deposition of an encapsulation of double layers 30. The substrate 10 is here heated to 80° C. at 1 mbar. Using nitrogen as carrier gas, octadecylphosphonic acid diethyl ester is introduced into the heated vacuum chamber for 10 min. The vacuum chamber is then reevacuated to less than $5 \times 10^{-6}$ mbar in order to remove excess octadecylphosphonic acid diethyl ester. After starting up the aluminium source, 100 nm of aluminium are deposited by evaporation.

This deposition process of the first 31 and second 32 layers may be repeated for example a further four times. Deposition of the double layer 30 may proceed in the same vacuum chamber as the deposition of the aluminium cathode. Deposition of the octadecylphosphonic acid diethyl ester proceeds at room temperature and the deposition time may be reduced to 2 min. The octadecylphosphonic acid dimethyl ester may furthermore be evaporated from a separate source.

Instead of pure aluminium, the alloy $AlMg_3$ may furthermore be applied by vapour deposition. Sputtering processes are used instead of an evaporation process. The second layer in the double layer 30 may take the form of a Ca layer.

Figure 7:
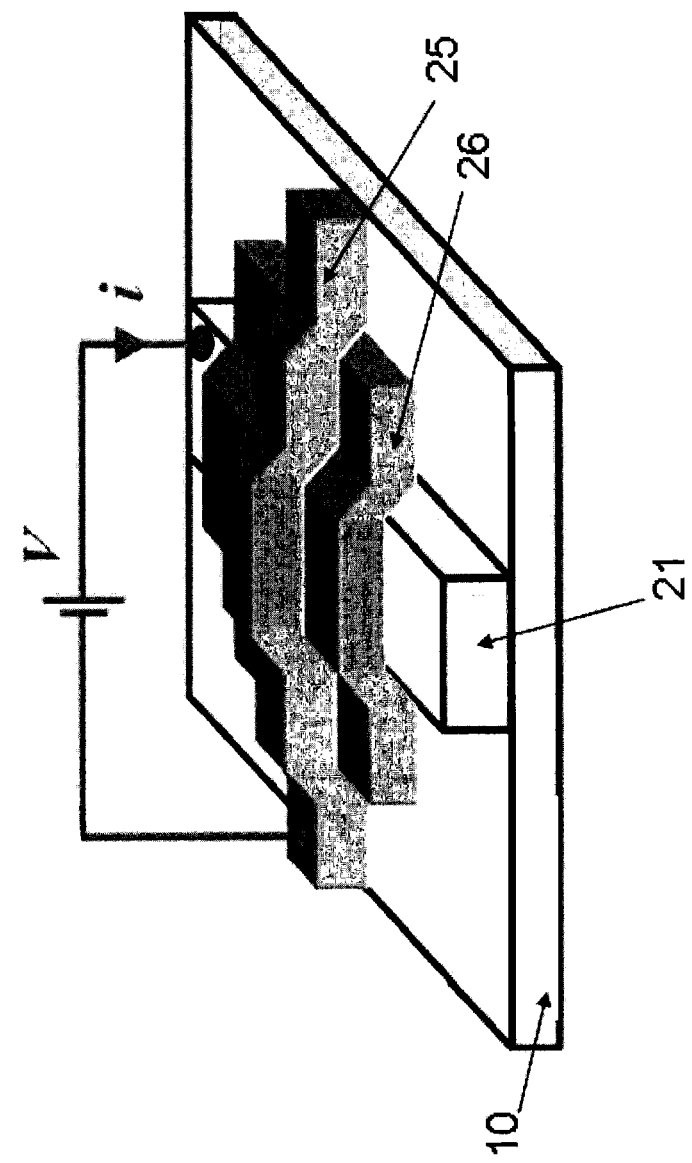
FIG. 7 shows a schematic, perspective view of a layer sequence.

FIG. 7 shows a schematic side view of a further component. In this case, an anode 21, an organic layer 26 and a cathode 25 are applied in patterned manner to the substrate 10. It is also shown here by way of example how a voltage V must be applied in order to operate the component. A voltage V is accordingly applied to the anode 21 and the cathode 25, such that a current i flows. This component may, for example, be an OMR layer sequence.

This layer sequence may be deposited or patterned on the substrate 10 by successive vapour deposition processes, after which a 20 nm to 2 μm, for example a 120 nm thick aluminium cathode is finally applied by vapour deposition. The layer sequence may be encapsulated in a similar way to the encapsulation explained in relation to the layer sequence of FIG. 6.

The embodiments shown in the figures may be varied as desired. It should furthermore be borne in mind that the invention is not restricted to the examples, but instead permits further developments which are not listed here.

The invention claimed is:

1. An electronic component comprising:
   a substrate;
   a layer sequence, which comprises at least one functional layer, on the substrate; and
   an encapsulation, which is arranged on the layer sequence and the substrate and, together with the substrate, completely encloses the layer sequence,
   wherein the encapsulation has at least two double layers,
   wherein a double layer has a first layer and a second layer disposed outside on the first layer,
   wherein the first layer is an organic monomolecular layer with a two-dimensional order,
   wherein the first layer comprises linear molecules with a length which is selected from the range 0.5 nm to 5 nm and has a thickness which corresponds to the length of the linear molecules,
   wherein the linear molecules comprise a first end group, a middle group and a second end group,
   wherein the first end group is selected from a group consisting of hydroxamic acids, oximes, isonitriles, phosphines, $R_1$—Si($R_2$)—$R_3$, O═C—$R_4$, O═P($R_5$)—$R_6$ and O═S($R_7$)═O, wherein:
   $R_1, R_2, R_3$ are mutually independently selected from H, Cl, Br, I, OH, O-alkyl groups, benzyl groups and unsaturated alkenyl groups, wherein at least one of $R_1$, $R_2$ and $R_3$ is not H,
   $R_4$ is selected from H, Cl, Br, I, OH, $OSiR_1R_2R_3$, O-alkyl groups, benzyl groups and unsaturated alkenyl groups,
   $R_5$ and $R_6$ are mutually independently selected from H, Cl, Br, I, OH, O-alkyl groups, benzyl groups and unsaturated alkenyl groups, and
   $R_7$ is selected from Cl, Br, I, OH, O-alkyl groups, benzyl groups and unsaturated alkenyl groups, and
   wherein the second end group is selected from a group consisting of unsubstituted aryl groups, substituted aryl groups, substituted aromatics, unsubstituted aromatics, substituted heteroaromatics and unsubstituted heteroaromatics.

2. The electronic component according to claim 1, wherein the middle group is selected from a group which comprises linear alkyls, linear fluorinated alkyls, polyethylene glycol and polyethylenediamine.

3. The electronic component according to claim 1, wherein the second layer includes a material which is selected from a group which comprises metals, metal alloys, metal oxides and polymers.

4. The electronic component according to claim 1, wherein the second layer has a thickness which is selected from the range 5 nm to 1 μm.

5. The electronic component according to claim 1, wherein chemical bonds and/or complex bonds and/or van der Waals interactions are present between the second layer and first end group and/or between the second layer and the second end group.

6. The electronic component according to claim 1, wherein the encapsulation has at least one third layer which binds water and oxygen molecules.

7. The electronic component according to claim 1, wherein the layer sequence is selected from a group which comprises organic light-emitting diodes, organic magnetoresistive components, inorganic magnetoresistive components, electrochromic display elements, organic solar cells, inorganic solar cells, organic photodiodes, inorganic photodiodes, organic sensors, inorganic sensors and surface wave filters.

8. A method for producing an electronic component according to claim 1, comprising the steps of:
   A) arranging said layer sequence, which comprises said at least one functional layer, on said substrate;
   B) arranging said encapsulation with at least two double layers on the substrate and the layer sequence, such that the layer sequence is completely enclosed by the substrate and the encapsulation,
   wherein method step B) comprises:
   B1) application of said first layer, and
   B2) application of said second layer, the first layer to be produced being an organic monomolecular layer with a two-dimensional order, wherein method steps B1) and B2) are alternately repeated at least twice.

9. The method according to claim 8, wherein in method step B1) a material for the first layer is applied from the gas phase or from a solution.

10. The method according to claim 9, wherein in method step B2) a material for the second layer is applied with a method which is selected from a group which comprises vapour deposition, sputtering, printing and electroless metallisation.

11. The method according to claim 10, wherein in method step B2) a chemical bond and/or a complex bond and/or a van der Waals interaction is/are formed between the first layer and the second layer.

12. An electronic component having
a substrate;
a layer sequence, which comprises at least one functional layer, on the substrate; and
an encapsulation, which is arranged on the layer sequence and the substrate and, together with the substrate, completely encloses the layer sequence,
wherein the encapsulation has at least two double layers,
wherein a double layer has a first layer and a second layer,
wherein the first layer is an organic monomolecular layer with a two-dimensional order,
wherein the first layer comprises linear molecules with a length which is selected from the range 0.5 nm to 5 nm and has a thickness which corresponds to the length of the linear molecules, and the linear molecules comprise a first end group, a middle group and a second end group,
wherein the first end group is selected from a group consisting of hydroxamic acids, oximes, isonitriles, phosphines, $R_1$—Si($R_2$)—$R_3$, O=C—$R_4$, O=P($R_5$)—$R_6$ and O=S($R_7$)=O, wherein:
$R_1$, $R_2$, $R_3$ are mutually independently selected from H, Cl, Br, I, OH, O-alkyl groups, benzyl groups and unsaturated alkenyl groups, wherein at least one of $R_1$, $R_2$ and $R_3$ is not H,
$R_4$ is selected from H, Cl, Br, I, OH, OSi$R_1R_2R_3$, O-alkyl groups, benzyl groups and unsaturated alkenyl groups,
$R_5$ and $R_6$ are mutually independently selected from H, Cl, Br, I, OH, O-alkyl groups, benzyl groups and unsaturated alkenyl groups, and
$R_7$ is selected from Cl, Br, I, OH, O-alkyl groups, benzyl groups and unsaturated alkenyl groups,
wherein the second end group is selected from a group consisting of unsubstituted aryl groups, substituted aryl groups, substituted aromatics, unsubstituted aromatics, substituted heteroaromatics and unsubstituted heteroaromatics,
wherein the second layer includes a material which is selected from a group which comprises metals, metal alloys, metal oxides and polymers, and
wherein chemical bonds and/or complex bonds and/or van der Waals interactions are present between the second layer and first end group and/or between the second layer and the second end group.

* * * * *